(12) United States Patent
Edo

(10) Patent No.: US 7,656,507 B2
(45) Date of Patent: Feb. 2, 2010

(54) PROCESSING UNIT, EXPOSURE APPARATUS HAVING THE PROCESSING UNIT, AND PROTECTION UNIT

(75) Inventor: Ryo Edo, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 255 days.

(21) Appl. No.: 11/363,955

(22) Filed: Mar. 1, 2006

(65) Prior Publication Data
US 2006/0197935 A1     Sep. 7, 2006

(30) Foreign Application Priority Data
Mar. 3, 2005   (JP) ............... 2005-058413

(51) Int. Cl.
G03B 27/62    (2006.01)
(52) U.S. Cl. .............. 355/75; 355/53; 355/77
(58) Field of Classification Search ........... 355/53, 355/75; 356/401; 430/5, 236; 250/492.2
See application file for complete search history.

(56) References Cited

U.S. PATENT DOCUMENTS

| 5,800,949 | A | 9/1998 | Edo et al. ............... 430/5 |
| 6,090,176 | A * | 7/2000 | Yoshitake et al. ......... 55/385.4 |
| 6,239,863 | B1 * | 5/2001 | Catey et al. .............. 355/75 |
| 6,317,479 | B1 | 11/2001 | Chiba et al. ............. 378/35 |
| 6,805,748 | B1 | 10/2004 | Edo ..................... 118/719 |
| 7,024,266 | B2 | 4/2006 | Edo ..................... 700/112 |
| 2003/0082030 | A1 * | 5/2003 | del Puerto et al. ......... 414/217 |
| 2003/0218728 | A1 | 11/2003 | del Puerto et al. ......... 355/51 |
| 2003/0227605 | A1 * | 12/2003 | del Puerto et al. ......... 355/51 |
| 2004/0005209 | A1 * | 1/2004 | Su et al. ................ 414/217.1 |
| 2005/0095829 | A1 * | 5/2005 | Hara .................... 438/584 |
| 2005/0121144 | A1 | 6/2005 | Edo et al. ............... 156/345.32 |
| 2006/0197935 | A1 | 9/2006 | Edo .................... 355/75 |
| 2007/0211232 | A1 * | 9/2007 | Phillips et al. ........... 355/30 |

FOREIGN PATENT DOCUMENTS

JP        10-092724        4/1998

* cited by examiner

*Primary Examiner*—Edward J Glick
*Assistant Examiner*—Steven H Whitesell-Gordon
(74) *Attorney, Agent, or Firm*—Fitzpatrick, Cella, Harper & Scinto

(57) ABSTRACT

A processing unit including a supply section for storing a mask having a patterned surface having a pattern to be exposed to a plate, the supply section being maintained under atmospheric pressure, a process chamber for processing the plate, the process chamber being maintained in a reduced pressure or vacuum atmosphere and the processing unit transferring the mask between the supply section and the process chamber, and a protection unit for protecting the patterned surface in a non-contact manner and for holding part of the mask other than the patterned surface. The protection unit covers the mask while opening at least a part of the other side surface of the patterned surface. The processing unit further includes a transfer unit for adsorbing the protection unit and for transferring the protection unit and the mask held by the protection unit, between the supply section and the process chamber.

9 Claims, 10 Drawing Sheets

US 7,656,507 B2

PROCESSING UNIT, EXPOSURE APPARATUS HAVING THE PROCESSING UNIT, AND PROTECTION UNIT

This application claims foreign priority benefit based on Japanese Patent Application No. 2005-058413, filed on Mar. 3, 2005, which is hereby incorporated by reference herein in its entirety as if fully set forth herein.

BACKGROUND OF THE INVENTION

The present invention relates generally to exposure apparatuses, and more particularly, to a processing unit that transfers a target, such as a mask, a semiconductor substrate, a liquid crystal display plane, and the like, from a supply section to a process chamber that exposes, in a manufacturing process for a semiconductor substrate, a liquid crystal display substrate, and the like.

In manufacturing a fine semiconductor device, such as a semiconductor memory, a logic circuit, and the like, by using a photolithography technique, a reduction projection exposure apparatus has so far been used that uses a projection optical system to project a circuit pattern to a wafer, and the like, thus transferring the circuit pattern.

A minimum size (resolution) to be transferred by a reduction projection exposure apparatus is in proportion to the wavelength of light used for the exposure, and is in inverse proportion to the numerical aperture ("NA") of a projection optical system. Accordingly, the shorter the wavelength becomes, the better the resolution becomes. For this reason, along with a requirement for a further fine semiconductor device in recent years, development of a shorter wavelength of exposure light has been promoted. As a result, the wavelength of ultraviolet ("UV") light to be used has become shorter, as with an extra high-pressure mercury lamp (i-line (a wavelength of about 365 nm)), a KrF excimer laser with a wavelength of about 248 nm, and an ArF excimer laser with a wavelength of about 193 nm.

However, due to a rapid demand for a finer semiconductor device, there is a limit to the lithography technique using the UV light. Therefore, in order to efficiently transfer an extremely fine circuit pattern of less than 0.1 µm, a reduction projection exposure apparatus is under development that uses an Extreme Ultraviolet ("EUV") light with a wavelength shorter than that of the UV light, e.g., a wavelength of about 10 nm to 15 nm. Such an exposure apparatus is called "an EUV exposure apparatus" hereinafter.

Since exposure light with a short wavelength, like EUV light, is heavily attenuated in the atmosphere, the exposure section (processing section) of an exposure apparatus is housed in a vacuum chamber, and the chamber is put in a vacuum atmosphere to reduce the exposure light attenuation. For such a processing unit, since a plate to be processed is transferred between a chamber having the processing section and a plate supply section in the atmosphere, a load lock chamber is provided. See, for example, Japanese Patent Application, Publication No. 10-092724. The plate to be processed is a mask (reticle) that is an original for exposure, and has a circuit pattern. The mask is classified into a transmission mask that transmits the exposure light, and a reflection mask that reflects the exposure light.

FIGS. 10A and 10B are schematic block diagrams showing a configuration of a conventional processing unit 1000. FIG. 10A is its sectional view, and FIG. 10B its top view. In the processing unit 1000, the inside of the process chamber 1100, which houses the processing section 1200, is made a highly vacuum atmosphere. The process chamber 1100 houses a second transfer unit 1110.

In the atmosphere, there is a clean booth 1300 having a carrier setting part 1310 as a plate supply section, and being provided such that it surrounds a first transfer unit 1320, which is structured so as to have access to the carrier setting part 1310 and the load lock chamber 1200.

The load lock chamber 1200 has a first gate valve 1210 shutting off the carrier setting part 1310 in the atmosphere and a second gate valve 1220 shutting off the process chamber 1100.

A description will now be given of an operation of the processing unit 1000. The first transfer unit 1320 takes a mask out of a carrier set in the carrier setting part 1310, and carries the mask up to the load lock chamber 1200. If the mask is transferred to the load lock chamber 1200 and placed on the setting table, the area on the atmospheric side is shut off by closing the first gate valve 1210, and the atmosphere of the load lock chamber 1200 is replaced.

When the atmosphere of the load lock chamber 1200 has been replaced, the second gate valve 1220 is opened, and the mask is taken out by a second transfer unit 1110 in the process chamber 1100, stored in the process chamber 1100, and transferred to the processing section 1120. The mask now set on a mask chuck 1122 in the processing section 1120 is aligned in accordance with a standard.

When an exposure operation is completed, the mask is removed from the mask chuck 1122 by the second transfer unit 1110, and transferred back to the load lock chamber 1200. When the mask is transferred to the load lock chamber 1200, the second gate valve 1220 is closed, and the atmosphere of the load lock chamber 1200 is replaced.

When the atmosphere of the load lock chamber 1200 has been replaced, the first gate valve 1210 is opened, the mask is taken out by the first transfer unit 1320, and is transferred to the carrier setting part 1310.

However, there is a problem in that when a mask is transferred or when the load lock chamber is changed to a vacuum atmosphere, particles (dust) adhere to the mask. For example, when the atmosphere of the load lock is replaced, particulate matter is blown up by an exhaust treatment, which will adhere to the mask. A mask to which such matter adheres does not transmit or reflect exposure light at a place where the particles adhere, which will cause the problem that high-quality exposure is impossible (an occurrence of defective exposure).

Accordingly, various methods are proposed to prevent the particles from adhering to a mask. For example, a method is proposed to apply a pellicle to a mask that protects a pattern surface from particles where a transferred pattern is formed, but in a processing unit that uses a shorter wavelength, such as EUV light, a pellicle may be inapplicable from the restrictions of its materials and structures used. As mentioned above, if the wavelength of the exposure light becomes very short, it will be inappropriate to use a glass material so far used for visible light and ultraviolet light, since absorption of light by the physical substance becomes very large, and further, because there will be no glass materials used in the wavelength region of the EUV light, the pellicle will not be applied.

Further, for the particles adhering to a mask when the load lock chamber is changed to a vacuum atmosphere, a method is proposed for controlling the particles being blown up, e.g., an attempt of a slow start or lowering the exhaust volume at the start of an exhaust operation (i.e., retarding the exhaust). However, if the exhaust is retarded, it will take a longer time to arrive at the state of a high vacuum atmosphere, thus bringing about throughput degradation, as might be expected.

In addition, a removable cover system is also proposed that covers the pattern surface of a mask and transfers the mask protected from particles, and uncovers it just before the exposure operation. Since adherence of the particles scarcely occurs in exposure under a high vacuum environment, the removable cover system is regarded as being effective in protecting the pattern surface of a mask. However, since the conventional removable cover system brings the cover in contact with the mask pattern side or the outside of the pattern, such contact generates particles. Since the pattern surface of a mask used for an EUV exposure apparatus has a multi-layered film laminated with a molybdenum layer and a silicon layer, and this multi-layered film is relatively soft compared to the base material of the mask (plate), it is apt to generate particles, especially through contact with the cover. Particles generated through contact between the mask and the cover get inside the cover, and are very likely to adhere to the pattern surface. Further, the mask used for an EUV exposure apparatus is transferred, usually with its pattern surface, in a direction of gravity (i.e., down), and the transfer mechanism gets into contact with the pattern surface (outer surface of the cover). Such contact creates a factor for causing a particle to occur.

Thus, a method for setting a mask on a frame and transferring this frame is proposed. This method limits the mask in contacting only the frame, and the cover and the transfer mechanism in contacting the frame. For the mask used for an EUV exposure apparatus, low thermal expansion glass, called Zerodure™, is used as a base material to circumvent a thermal effect. In order to keep flatness of the pattern surface, it is necessary to suction-hold the entire surface of the backside of the mask (i.e., the backside of the pattern surface), considering the strength of the base material. Accordingly, in the method that transfers the frame with the mask set, when the entire surface of the backside of the mask is vacuum attracted, the frame is also vacuum attracted. If the frame is higher than the mask, even though slightly, the mask gets off from the frame, and is adsorbed by the mask chuck. In this case, when the mask is detached from the mask chuck, contact is made between the frame and the pattern surface, causing particles. On the other hand, if the mask is higher than the frame, even though slightly, the mask never detaches itself, but the mask becomes stressed by a strength with which the frame is adsorbed to the chuck, which changes the shape of the mask, thus, influencing the flatness of the pattern surface.

BRIEF SUMMARY OF THE INVENTION

The present invention is directed to a processing unit that provides high-quality processing by preventing particles from adhering to a mask, an exposure apparatus having the processing unit, and a protection unit.

A processing unit according to one aspect of the present invention includes a supply section for storing a mask having a pattern surface having a pattern to be exposed to a plate, the supply section being maintained under atmospheric pressure, a process chamber for processing the plate, the process chamber being maintained in a reduced pressure or vacuum atmosphere, the processing unit transferring the mask between the supply section and the process chamber, a protection unit for protecting the pattern surface in a non-contact manner and for holding part of the mask other than the pattern surface, and a transfer unit for adsorbing the protection unit and for transferring the protection unit and the mask held by the protection unit, between the supply section and the process chamber.

An exposure apparatus according to another aspect of the present invention includes the processing unit described above to expose the mask pattern to the plate.

A protection unit according to still another aspect of the present invention used to transfer a mask having a pattern surface having a pattern to be exposed onto a plate includes a holding part that includes a contact part for contacting part of the mask other than the pattern surface, the holding part holding the mask via the contact part, and a cover part, connected to the holding part, for protecting the pattern surface, a space being provided between the pattern surface and the cover part.

An exposure method according to still another aspect of the present invention for exposing a pattern of a mask onto a plate using an exposure apparatus housed in a process chamber under a reduced pressure or vacuum atmosphere includes the steps of holding the mask via the above protection unit, adsorbing the holding part of the protection unit that holds the mask and transferring the holding part and the mask to the process chamber, and separating the protection unit from the mask in the process chamber.

An exposure apparatus according to still another aspect of the present invention includes an exposure mode that executes the above exposure method.

A device fabrication method includes the steps of exposing a plate by using the above exposure apparatus, and developing the plate that has been exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
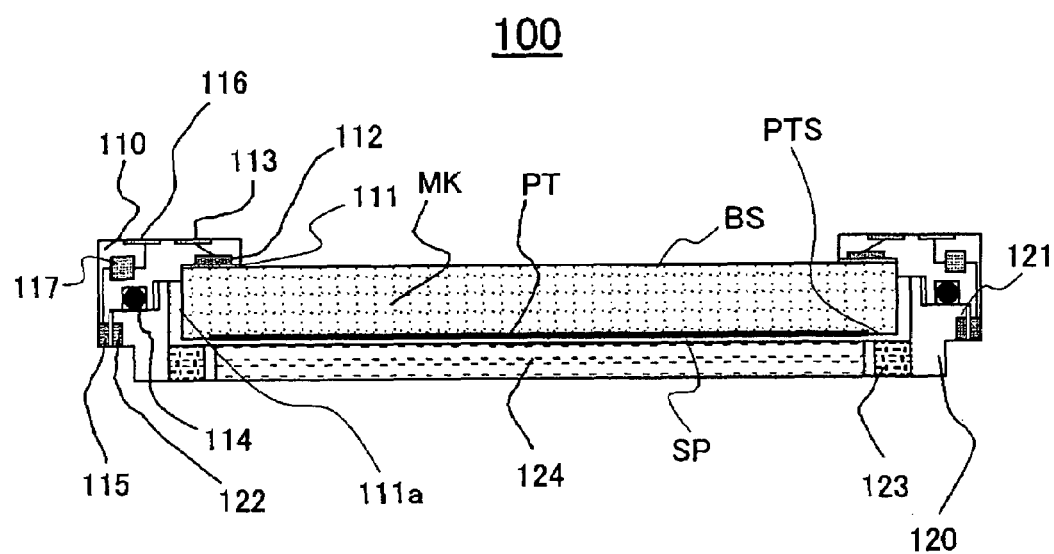
FIG. 1 is a schematic sectional view of a protection unit as an aspect of the present invention.

Referring to the accompanying drawings, a description will be given below of the preferred embodiments of the present invention. In each figure, the same reference numeral is assigned to the same member, avoiding a duplicate explanation. Here, FIG. 1 is a schematic sectional view showing the structure of a protection unit 100 as an aspect of the present invention.

The protection unit 100, which is used when transferring a mask MK having a pattern surface PTS, on which a pattern PT to be exposed onto a plate is formed, keeps the pattern surface in a non-contact state, as well as holding the mask MK at other than its pattern surface PTS. As shown in FIG. 1, the protection unit 100 has a holding part 1210 and a cover part 120.

The holding part 110 has a contact part 111 that contacts the mask MK at other than the pattern surface PTS, contacting the backside of the mask MK in this embodiment. The holding part 110 holds the mask MK via the contact part 111. As shown in FIG. 1, a dent 111a is formed in the counterpart 111, into which the mask MK fits. In other words, the side face of the mask MK touches the holding part 110 (the dent 111a), by which the position of the mask MK in relation to the holding part 110 is determined uniquely. However, the fact that the mask MK is positioned through the fitting of the side face of the mask MK and the dent 111a of the holding part 110 has nothing to do with the essence of the present invention. Therefore, the position between the holding part 110 and the mask MK may vary relatively.

The contact part 111, which is in contact with the backside BS of the mask MK, suction-holds the mask MK in this embodiment. The contact part 111 is composed of a soft material, e.g., of polyimide resin, and the like, fulfilling the function of filling up a space between the holding part 110 and the mask MK when suction-holding the mask MK.

In this embodiment, an electrostatic adsorption pad 112 is incorporated in the contact part 111. An electrode 113, which supplies electricity to the electrostatic adsorption pad 112, is provided on the surface of the side opposite to the contact part 111 of the holding part 110.

The holding part 110 has a seal mechanism 114 at a place connected to the cover part 120 to be described later. The seal mechanism 114, which has no constraints if it has a sufficient sealing capability, should preferably use such materials (a soft material, and the like) and shapes so as to cause no particle to be generated when contacting and detaching from the mask MK. In this embodiment, an O-ring is used for the seal mechanism 114.

A cover holding mechanism 115 is installed at one end of the holding part 110. In the present embodiment, the cover holding mechanism 115 is comprised of an electrical magnet, and, as shown in FIG. 1, it is provided with an electrode 116 supplying the electromagnet with electricity and a condenser 117 temporarily retaining electricity.

The cover part 120 is connected to the holding part 110 such that it has a space SP between the pattern surface of the mask MK and itself, thus protecting the pattern surface PTS. In other words, the cover part 120 covers the pattern surface PTS, and isolates the pattern surface from its surroundings.

The cover part 120 has a cross-sectional shape with a convex part 121 to fit into the holding part 110. The convex part 121 is dimensionally set up such that when fitted into the holding part 110, it has a slight space in between (namely, no contact with the holding part 110), having a so-called labyrinth structure.

At a position facing the cover holding mechanism 115 of the cover part 120, a holding mechanism 122 is provided. In the embodiment, the holding mechanism 122 is composed of a magnetic substance or a permanent magnet. Accordingly, the cover part 120 is, in effect, connected to the holding part 110 while electricity is supplied to the cover holding mechanism 115 comprised of an electrical magnet. On the other hand, if electrical supply to the cover holding mechanism is cut off, the connection between the holding part 110 and the over part 120 is canceled.

To allow gas exhaust from the space SP and gas introduction to the space SP, the cover part 120 is provided with an air permeable filter 123. The filter 123 also has the function of preventing particles of a specific size from entering the space SP, and, in this embodiment, a membrane filter is used that has a trapping efficiency of 99.9999% for a particle of 30 nm. However, the filter 123 is not limited to this one. For example, as a filter 123, a filter that can remove a specified chemical composition may be used, which can be used together with a filter eliminating particles.

The cover part 120 has a transmission window 124 that transmits light to a place corresponding to the pattern PT of the mask MK. For the transmission window 124 in this embodiment, quartz is used, assuming that a TA-AA mechanism uses visible light for an alignment mechanism of the mask MK. However, for the transmission window, various materials can be selected in accordance with an alignment mechanism. The transmission window 124 and the cover part 120 are closely joined, thus being structured such that particles larger than 30 nm may not enter the space SP.

In the transfer process in which particles easily adhere to the pattern surface PTS, the protection unit 100 uses the cover part 120 to protect the pattern surface PTS of the mask MK, and so, this can prevent particles from adhering to the pattern surface PTS. Further, since the cover part 120 is connected to the holding part 110 holding the backside BS of the mask MK, and does not contact the pattern surface PTS of the mask MK, occurrence of particles from a contact of the cover part 120 and the pattern surface PTS never arises. Since the cover part 120 is provided with a transmission window 124, it is possible to align the mask MK, for example, while the protection unit 100 is holding the mask MK.

Figure 2:
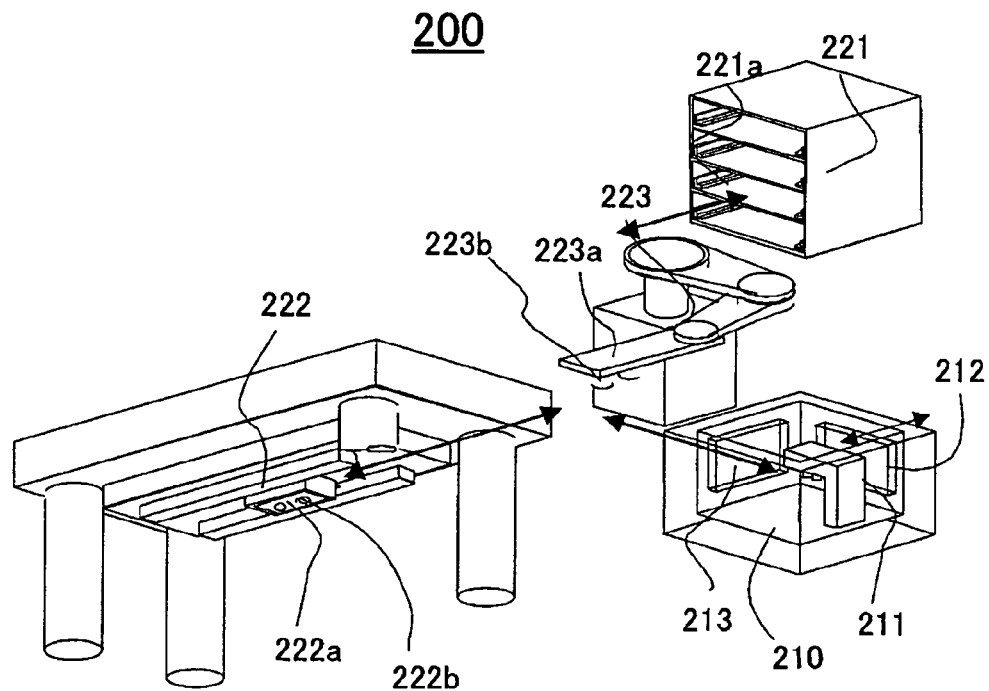
FIG. 2 is a schematic perspective view showing a disassembled structure of the protection unit as an aspect of this invention.
Figure 3:
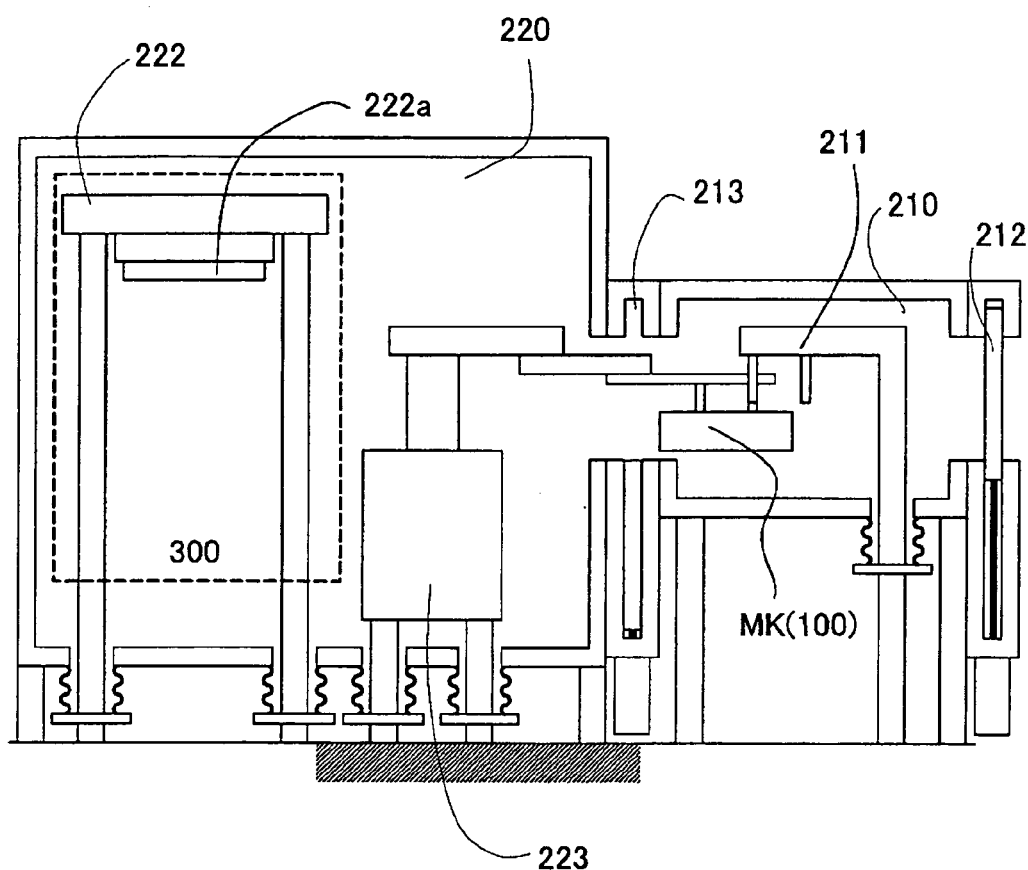
FIG. 3 is a schematic sectional view showing the structure of the processing unit as an aspect of this invention.

Next, referring to FIGS. 2 and 3, a description will be given of a processing unit 200 as an aspect of this invention. FIG. 2 is a schematic perspective view showing the processing unit 200 by decomposing it into parts. FIG. 3 is a schematic sectional view showing the structure of the processing unit 200.

The processing unit 200 of this embodiment transfers the mask MK (the mask MK held by the protection unit 100) as a transferred object, proceeding to an exposure process using the transferred mask MK, but this invention does not limit the processing of the processing unit 200 to the exposure process. However, as mentioned above, the exposure process requires a mask with few particles adhering to it, and so, it is suitable to this invention.

As shown in FIG. 3, the processing unit 200 has a carrier setting part as a mask supply section where one or more masks are stored and held under atmospheric pressure, and a load lock chamber 210 that is kept in any low vacuum atmosphere. Further, it includes an exposure apparatus 300 explained later with reference to FIG. 7 as a processing part performing an exposure operation by using a mask, and a process chamber 220 that is kept in high vacuum pressure.

One or more load lock chambers 210 are provided, having a holding means 211 inside that holds the protection unit 100 when replacing the atmosphere. The load lock chamber 210 is connected to the carrier setting part on the atmospheric side via first gate valve 212, and to the process chamber 220 via a second gate valve 213.

The process chamber 200 has a mask stocker 221, a mask stage 222 and a transfer unit 223. Although the mask stage 222 is in fact a component of the exposure apparatus 300 described later, it is included as part of the processing unit 200 for the convenience of explanation.

The mask stocker 221 temporarily stocks masks MK transferred to the process chamber 220 (the protection unit 100), and has more than one stock space 221a depending on the usage condition of the unit 100. By the way, the mask stocker 221 may not be provided depending on the structure of the unit 100.

The mask stage 222 holds a mask MK at the time of an exposure operation, having the function of scanning and driving when transferring a mask pattern to a wafer. For an EUV exposure apparatus, since exposure uses a pattern surface of mask MK facing in a direction of gravity (down), the mask chuck 222a that suction-holds a mask is structured such that it hangs down from the mask stage 222.

The mask chuck 222a has a back-and-forth movable adsorption pad 222b. The adsorption pad 222b is required to stably suction-hold a mask MK, and if this requirement is met, it may have one or at least two or more adsorption pads. As described above, since the mask stage 222 holds a mask with its pattern surface in a gravity direction, it follows that the adsorption pad 222b suction-holds the mask MK from its back.

The adsorption pad 222b can generate an adsorbing power of about 4 kgf/cm$^2$. Accordingly, even if the weight of the protection unit 100 is added to a mask of about several hundred grams, the adsorption pad 222b can have a sufficient adsorbing power if an adsorption area of about 1 cm$^2$ can be assured.

The transfer unit 223 is a structure such that it can access the load lock chamber 210, mask stocker 221, and mask stage 222, respectively. The transfer unit 223 is composed of an arm 223a having the electrostatic adsorption pad 223b at its front end that adsorbs the backside of the mask.

The holding means 211 of the load lock chamber 210, the stock space 221a of the mask stocker 221 and the mask chuck 222a of the mask 222 are all structured such that they can get hold of the backside of a mask MK.

Here, a description will be given of the operation of the processing unit 220, i.e., a mask transfer. First, the transfer unit enters the carrier setting part in the atmosphere (not shown), taking out the mask MK (protection unit). The transfer unit holding a mask MK pulls in the arm to check the status of the load lock chamber 210. At this time, the mask is held by the protection unit 100, and is transferred with its pattern surface protected by the cover part 120.

Figure 4A:
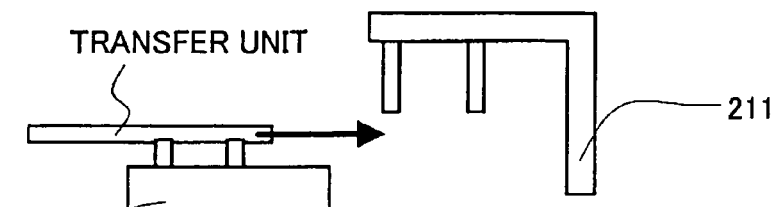
FIGS. 4A-4E are schematic sectional views showing how a transfer unit in the air transfers a mask (protection unit) to a holding means in a load lock chamber.
Figure 4B:
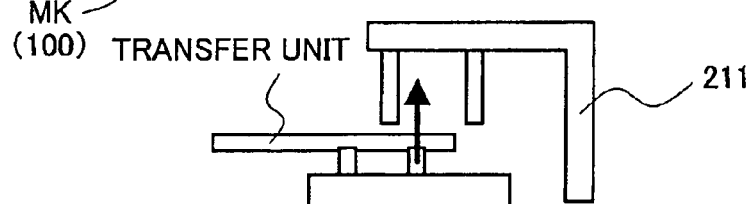
Figure 4C:
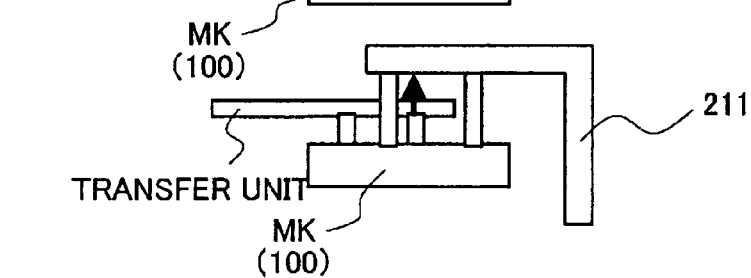

If the load lock chamber 210 is in the state of accepting the mask, in other words, the atmosphere is properly set and the first gate valve 212 is open, the transfer unit enters the load lock chamber 210 holding the backside of the mask MK (protection unit 100), as shown in FIG. 4A. The transfer unit that comes in keeping its specific height in FIG. 4 rises, as shown in FIG. 4A, at the position of the holding means 211, and the backside of the mask MK touches the holding means 211 (see FIG. 4A). Here, FIGS. 4A-4E are schematic sectional views showing how the transfer unit in the atmosphere is transferring the mask MK (the protection unit 100) to the holding means 211 of the load lock chamber 210.

Figure 4D:
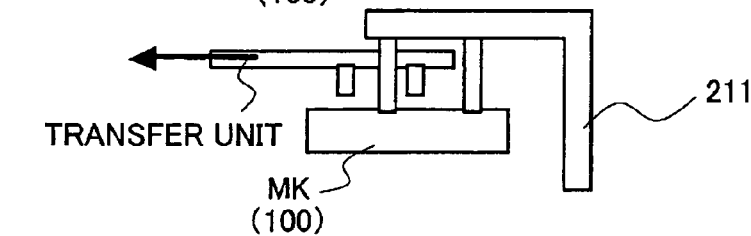
Figure 4E:
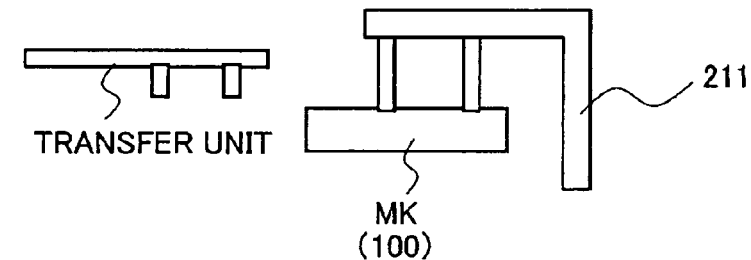

Next, when the backside of the mask MK is suction-held by the holding means 211 of the load lock chamber 210, the suction-holding of the mask MK by the transfer unit is released, and, as shown in FIG. 4D, the transfer unit goes up and gets away from the mask MK. The transfer unit that is away from the mask MK withdraws from the load lock chamber 210, thus completing the transfer of the mask (the protection unit 100) to the load lock chamber 210.

When the transfer of the mask MK to the load lock chamber 210 is completed, the atmosphere of the load lock chamber 210 is replaced. More specifically, when the first gate valve 212 and the second gate valve 213 are closed, and the atmospheric side and the process chamber 220 are shut off from each other, a vacuum exhaust valve (not shown) is opened, and the gas of the load lock chamber 210 is exhausted by a vacuum exhaust pump (not shown) through a vacuum exhaust pipe (not shown). When the load lock chamber 210 is evacuated to a specific point of vacuum, the vacuum exhaust valve is closed to stop the vacuum exhaust.

When the atmosphere of the load lock chamber 210 has been replaced, gas flows into the load lock chamber 210. At this time, those particles present beforehand in the gas, those particles adhering to the load lock chamber 210, or those particles adhering to the transfer unit are blown up by the gas flow. Most of the particles blown up are exhausted out with the flow of the gas, but a portion of the particles may adhere to respective places of the load lock chamber 210. Those particles can possibly adhere to the mask MK, but, in this embodiment, the pattern surface is protected by the protection unit 100 (the cover part 120), and so, in no way do particles cling to the pattern surface. They just adhere to only the protection unit 100.

Figure 5A:
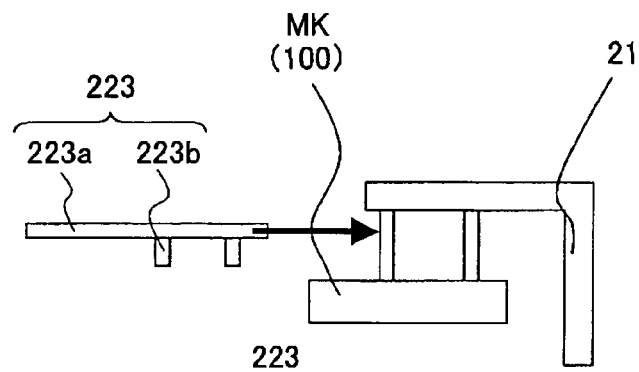
FIGS. 5A-5E are schematic sectional views showing how a transfer unit in the load lock chamber transfers the mask (protection unit).
Figure 5B:
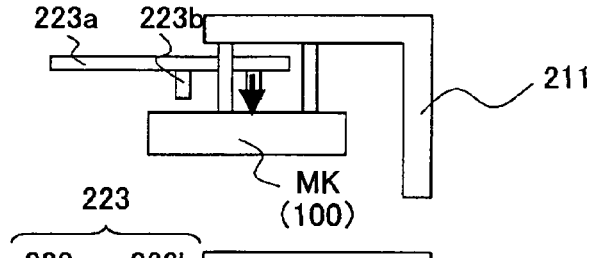
Figure 5C:
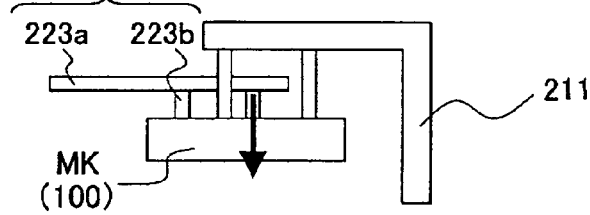

When the replacement of the atmosphere of the load lock chamber 210 is completed, the second gate valve 213 is opened, the mask MK (the protection unit 100) is taken out by the transfer unit 223 in the process chamber 210, and transferred to the process chamber 210. To be concrete, at first, the transfer unit 223 goes into the load lock chamber 210, as shown in FIG. 5A. The transfer unit 223, which came in at a specific elevation up to the holding means 211 in FIG. 5A, goes down, as shown in FIG. 5B, and the electrostatic adsorption pad 223b gets into contact with the backside of the mask MK (See FIG. 5C). Here, FIGS. 5A-5E are schematic sectional views showing how the transfer unit 223 in the load lock chamber 210 transfers a mask MK (the protection unit 100).

Figure 5D:
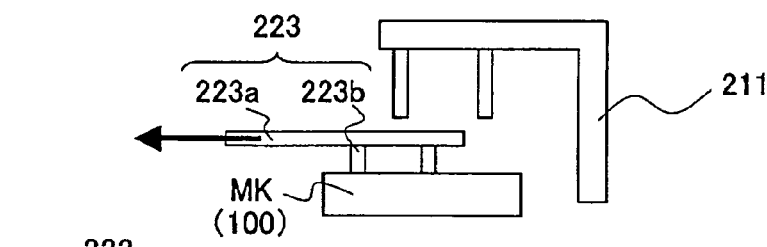
Figure 5E:
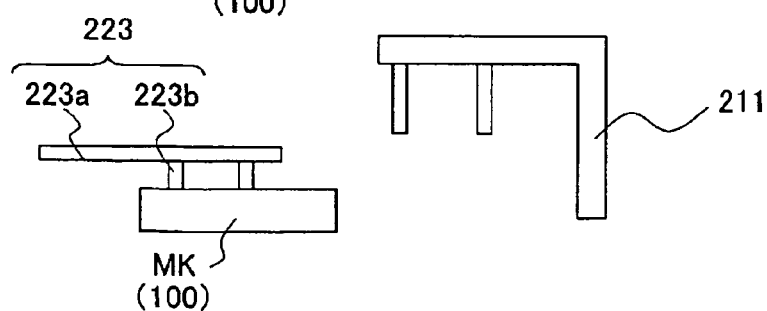

If the electrostatic adsorption pad 223b of the transfer unit 223 contacts the backside of the mask MK, the electrostatic adsorption pad 223b suction-holds the backside of the mask MK. When the mask MK is vacuum attracted by the transfer unit 223, the suction-holding of the mask MK by the holding means 211 of the load lock chamber 210 is released, and, as shown in FIG. 5D, the transfer unit 223 further lowers, and the mask MK detaches from the holding means 211. The transfer unit 223 suction-holding the backside of the mask MK withdraws the arm 223a while holding the mask MK, and transfers the mask MK (the protection unit 100) from the load lock chamber 210 to the process chamber 220.

The mask MK (protection unit 100) transferred into the process chamber 220 is transferred to an alignment station (not shown). At the alignment station, an alignment mechanism (not shown) measures an alignment mark (not shown) provided on the mask MK via a transmission window 124 of the cover part 120 of the protection unit 100. If a shift of the mask MK with respect to a specified position is determined from the measurement of the alignment mark, the transfer position of the mask MK is corrected based on such a shift of the mask MK.

Next, the aligned mask MK is transferred to the mask stage 222 (mask chuck 222a) by the transfer unit 223. As mentioned above, the transfer position of the mask MK on the mask chuck 222a is corrected based on information about a shift of a position obtained by the alignment mechanism. By so doing, the relative positions of the mask MK and the mask chuck 222a are always kept constant at each transfer time.

Figure 6A:
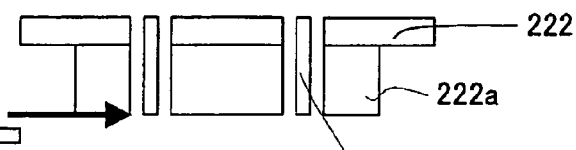
FIGS. 6A-6F are schematic sectional views showing how the transfer unit in the load lock chamber transfers the mask (protection unit) to a reticle chuck of a mask stage.
Figure 6B:
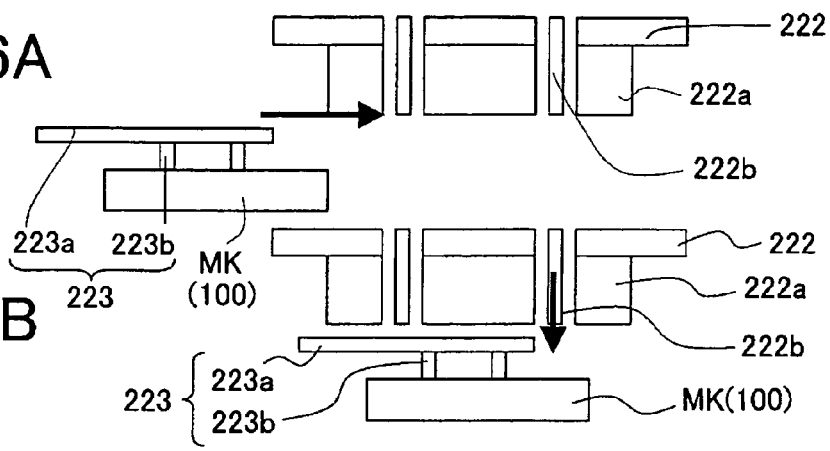

As shown in FIG. 6A, as to the transfer of the mask MK to the mask chuck 222a by the transfer unit 223, the transfer unit 223 holding the mask MK, first, goes to the transfer position corrected based on information about a shift of a position obtained by the alignment mechanism. After that, as shown in FIG. 6B, the adsorption pad 222b of the mask chuck 222a goes down as long as it touches the backside of the mask MK. Here, FIGS. 6A-6F are schematic sectional views showing how the transfer unit 223 of the load lock chamber 210 transfers the mask MK (the protection unit 100) to the reticle chuck 222a of the mask stage 222.

Figure 6C:
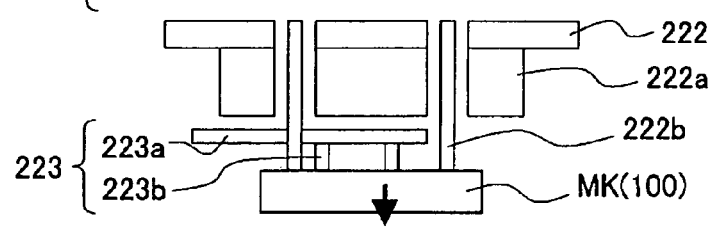
Figure 6D:
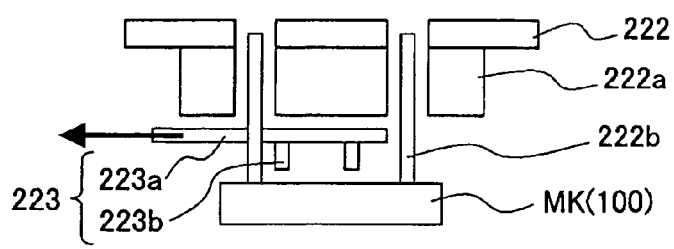

When the adsorption pad 222b of the mask chuck 222a touches the backside of the mask MK, the adsorption pad 222b suction-holds the backside of the mask MK as shown in FIG. 6C. If the mask MK is adsorbed by the adsorption pad 222b, suction-holding of the mask MK by the electrostatic adsorption pad 223b of the transfer unit 223 is released, and the transfer unit 223 withdraws to the original position as shown in FIG. 6D.

Figure 6E:
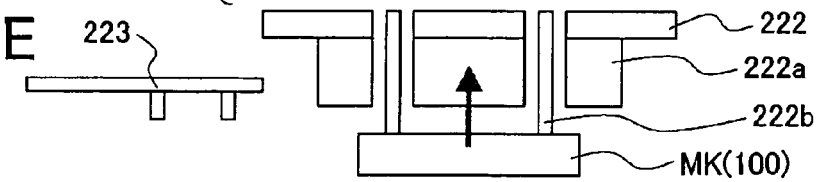
Figure 6F:
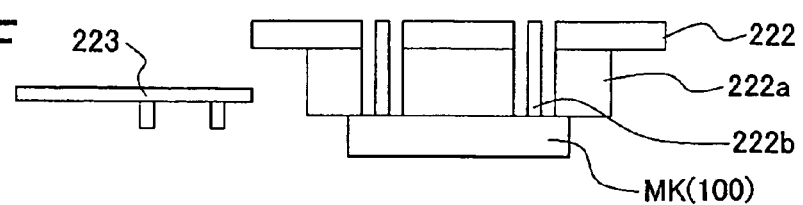

When the withdrawal of the transfer unit 223 is completed, the adsorption pad 222b suction-holding the mask MIK goes up, as shown in FIG. 6E, to the position where the backside of the mask MK and mask chuck 222a come into contact with each other (See FIG. 6F). When the backside of the mask MK and the mask chuck 222a come into contact with each other, the mask chuck 222a suction-holds the whole backside of the mask MK. The surface of the mask chuck 222a is formed to be a very high-precision flat plane, and its flatness is as equally flat or more flat than the one required for the pattern surface of the mask MK. By being suction-held by the mask chuck 222a having a high-precision flatness, the mask MK is corrected in terms of the flatness, even if it has a deviation from the specified flatness in the blanks, thus attaining the specified flatness.

When the mask MK is suction-held by the mask chuck 222a, the protection unit 100 is removed, and the pattern surfaced of the mask MK is exposed, completing preparations for the exposure operation. To remove the protection unit 100 from the mask MK, first, a supply of electricity to the cover holding mechanism 115 is terminated to release the connection between the holding means 110 and the cover part 120. The cover part 120 is held by a cover release mechanism (not shown) and taken away in an as-is state.

The cover release mechanism may be provided on the mask chuck 222a or provided in its neighborhood as a dedicated mechanism, or may be implemented by adding to the transfer unit 223 the function of holding the cover part 120 so that the transfer unit 223 may double as a cover release mechanism, thus imposing no special limitation on the structure.

The protection unit 100 may be removed from the mask MK, as mentioned above, after the transfer unit 223 has withdrawn. The transfer unit 223 may withdraw after the holding part 110 and the cover part 120 are disconnected from each other after the mask MK is held by the mask chuck 222a.

In this way, the mask MK is held at the specified position of the mask stage 222 since its positional shift is measured by the alignment mechanism and then corrected before the mask MK has been transferred to the mask stage 222 (the mask chuck 222a). Further, since the pattern surface of the mask MK is protected by the protection unit 100 in the entire course of its transfer process and is carried with its backside suction-held, particles can be prevented from adhering to it during the transfer process. Further, once the mask is held by the mask chuck 222a, and the protection unit 100 has been removed, there is no chance for particles to adhere to the pattern surface directed in a direction of gravity, since the mask is put under high vacuum circumstances. In other words, it is possible to perform high-precision exposure by preventing particles from adhering to the pattern surface of the mask MK. Further, since no particles adhere to the patterns of the mask MK, exposure can be started right after the mask has been transferred to the mask stage 222, improving throughput.

Figure 7:
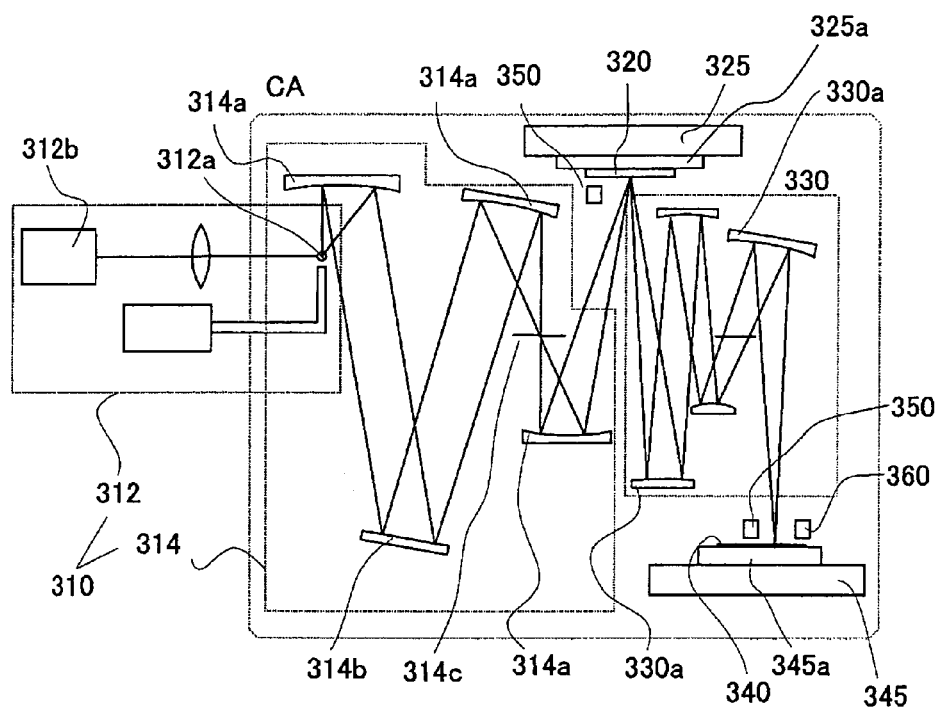
FIG. 7 is a schematic sectional diagram showing a structure of the exposure apparatus shown in FIG. 1.

Here, referring to FIG. 7, a description will be given of the exposure apparatus 300 included in the process chamber 210 as the processing section. FIG. 7 is a schematic sectional view showing the structure of the exposure apparatus 300 shown in FIG. 3.

The exposure apparatus 300 is a projection exposure apparatus that uses EUV light (e.g., with a wavelength of 13.4 nm) as exposure illumination light to expose a circuit pattern formed on a mask 320 onto a plate 340 by a step-and-scan method. However, the exposure apparatus 300 can also adopt a step-and-repeat method. Such an exposure apparatus is suitably applicable to a photolithography process of a sub-micron or a quarter-micron or less, and a description will be given below of a step-and-scan exposure apparatus (which is also referred to as a "scanner") as an example. The "step-and-scan" manner, as used herein, is one mode of exposure method which exposes a pattern onto a mask onto a wafer by continuously scanning the wafer relative to the mask, and by moving, after a shot of exposure, the wafer stepwise to the next exposure area to be shot. The "step-and-repeat" manner is another mode of an exposure method which moves a wafer stepwise to an exposure area for the next shot, every shot onto the wafer.

Referring to FIG. 7, the exposure apparatus 300 includes an illumination apparatus 310 illuminating the mask 320 on which a circuit pattern is formed, and a mask stage 325 on which a mask 320 is set. It also includes a projection optical system 330 that projects diffracted light arising from an illuminated mask pattern onto a plate 340. Further, it includes a wafer stage 345 on which the plate 340 is set, an alignment detecting mechanism 350, and a focus position detection mechanism 360.

As shown in FIG. 7, EUV light, whose transmission rate to the atmosphere is low, generates contamination by reaction to a residual gas (such as polymer organic gases, and the like) ingredient. For this reason, at least a light path where the EUV light travels (i.e., the whole optical system) is a vacuum atmosphere CA contained in the process chamber 210.

The illumination apparatus 310 is an illumination apparatus that uses arc-shaped EUV light (e.g., with a wavelength of 13.4 nm or so) for the arc-shaped visual field of the projection optical system 330 to illuminate the mask 320, and accordingly, it includes an EUV light source section 312 and an illumination optical system 314.

For the EUV light source section 312, for example, a laser plasma light source is used. The laser plasma light source irradiates a high-intensity pulse laser beam, emitted from a laser light source 312b, to a target material 312a set in a vacuum, generates high-temperature plasma, and uses EUV light, e.g., with a wavelength of about 13.4 nm. Alternatively, the EUV light source section 312 can also use a discharge plasma light source. However, the EUV light source section 312 is not limited to these, but any technique known in the art is applicable.

The illumination optical system 314 is composed of a condenser mirror 314a and an optical integrator 314b. The condenser mirror 314a performs the function of gathering EUV light approximately isotropically irradiated from the laser plasma light source. The optical integrator 314b has the function of illuminating the mask 320 uniformly by using a specified numerical aperture. The illumination optical system 314 has an aperture 314c provided at a position conjugate with the mask 320 to limit the illumination area of the mask 320 to an arc shape.

The mask 320 is a reflection-type mask, on which a circuit pattern (or image) to be transferred is formed, and which is held and driven by a mask stage 325. Diffracted light emitted from the mask 320 is reflected by the projection optical system 330 and projected onto the plate 340. The mask 320 and the plate 340 are arranged in optically conjugate positions. Since the exposure apparatus 300 is a scanner, scanning the mask 320 and the plate 340 enables the pattern on the mask 320 to be projected. The mask 320, which is transferred by the processing unit 200 using the protection unit 100 described above, facilitates a high-precision exposure operation to be performed with no particles adhering.

The mask stage 325 holds the mask 320 via a mask chuck 325 and is connected to a transfer mechanism (not shown). Any structure known in the art is applicable to the mask stage 325. The transfer mechanism (not shown) is composed of a linear motor, and the like, to move the mask 320 by driving the mask stage 325 at least in an X direction. The exposure apparatus 300 scans the mask 320 and the plate 340 in a synchronous way. Here, it is determined that a scanning direction in the plane of the mask 320 or the plane of the plate 340 is X, a direction vertical to that is Y, and a direction vertical in the plane of the mask 320 or the plane of the plate 340 is Z.

The projection optical system 330 uses a plurality of reflecting mirrors (multi-layered film mirrors) 330a to project a pattern on the mask 320 onto the plate 340 as an image field. The number of plural mirrors 330a is four to six or so. In order to form a broad exposure region using a few mirrors, only a thin ring-shaped region (ring field) a constant distance away from the optical axis is used, to simultaneously scan the mask 320 and the plate 340, transferring a broad area. The projection optical system 330 is comprised of four mirrors 330a in this embodiment, having a 0.2 to 0.4 numerical aperture (NA).

The plate 340 is a wafer in this embodiment, but it includes a wide range of plates, such as a liquid crystal plate and other plates. A photo-resist is applied to the plate 340. In addition, the plate 340 can be transferred by the processing unit 200 using the protection unit 100 described above, so as to contribute to high-quality exposure by preventing particles from adhering to it.

The wafer stage 345 holds the plate 340 via its wafer chuck 345a. The wafer stage 345 uses, e.g., a linear motor to move the plate 340 in X-Y-Z directions. The mask 320 and the plate 34 are synchronously scanned. Further, the position of the mask stage 325 and the position of the wafer stage 345 are monitored by, e.g., a laser interferometer, and the like, and the two are driven at a constant speed ratio.

An alignment detecting mechanism 350 measures a positional relationship between the position of the mask 320 and the optical axis of the projection optical system 330, and that between the position of the plate 340 and the optical axis of the projection optical system 330. Then, the positions and angles of the mask stage 325 and the wafer stage 345 are set such that a projected image of the mask 320 corresponds to a specified position of the plate 340.

A focus position detecting mechanism 360 measures the focus position in a Z direction on the surface of the plate 340, and controls the position and angle of the wafer stage 345, thereby constantly keeping the surface of the plate 340 as the position for image-forming by the projection optical system 330 during exposure.

During exposure, EUV light emitted from the illumination apparatus 310 illuminates the mask 320, image-forming the pattern on the mask 320 onto the surface of the plate 340 as the position for image-forming by the projection optical system 330 during exposure.

During exposure, EUV light emitted from the illumination apparatus 310 illuminates the mask 320, image-forming the pattern on the mask 320 onto the surface of the plate 340. The image field in this embodiment is a ring-shaped image field, and by scanning the mask 320 and the plate 340 at a speed ratio of the reduction ratio, the whole surface of the mask 320 is exposed. Since the exposure apparatus 300 uses the mask and/or the plate transferred by the processing unit 200 using the protection unit 100, it can prevent particles from adhering to them. Further, it can provide higher-quality devices (such as semiconductor devices, LCD devices, imaging devices (CCDs, and the like), thin-film magnetic heads, and the like) with more economical efficiency and higher throughput.

Figure 8:
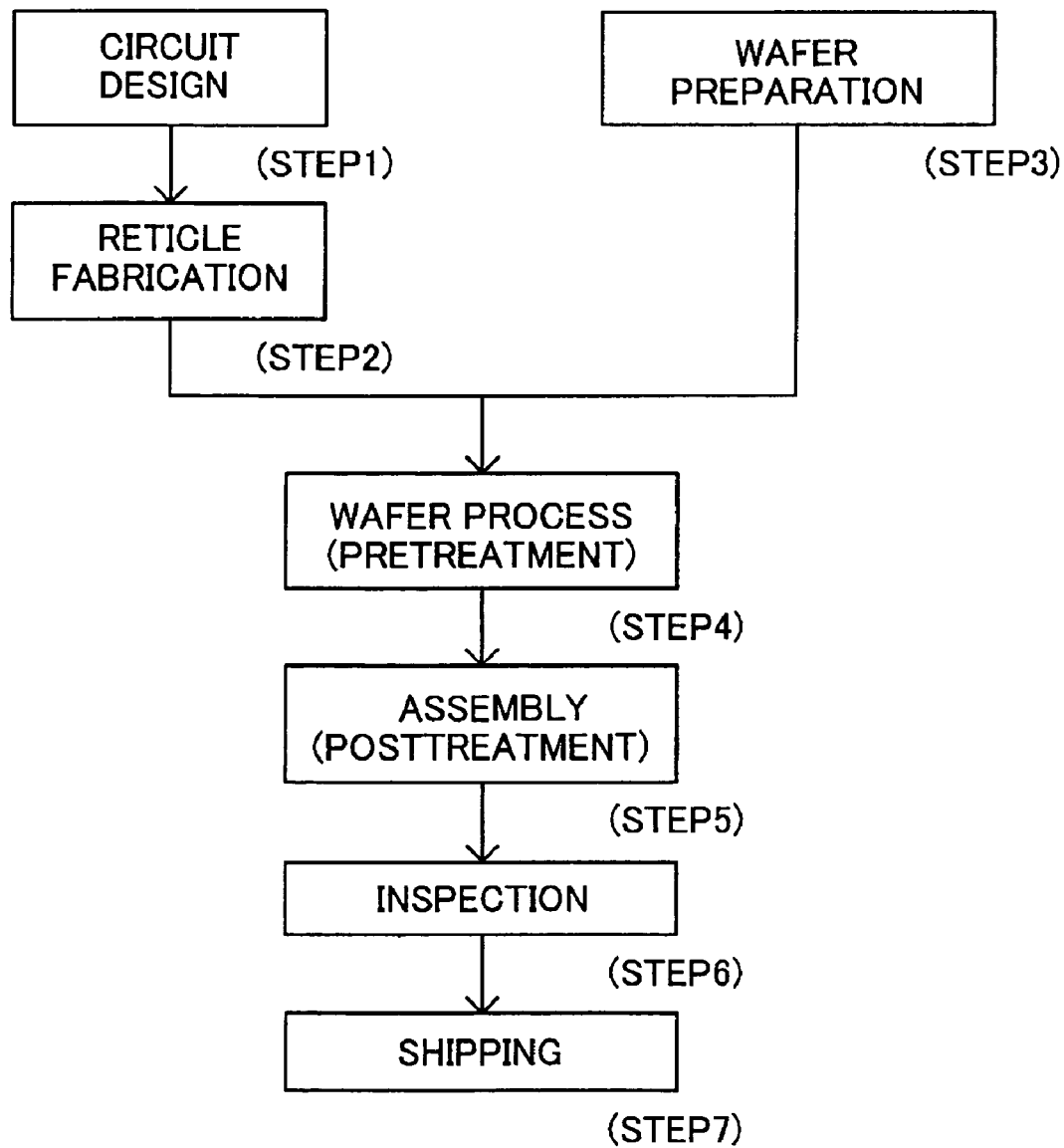
FIG. 8 is a flowchart for explaining how devices (such as semiconductor chips, such as ICs, LSIs, and the like, LCDs, CCDs, and the like, are fabricated).
Figure 9:
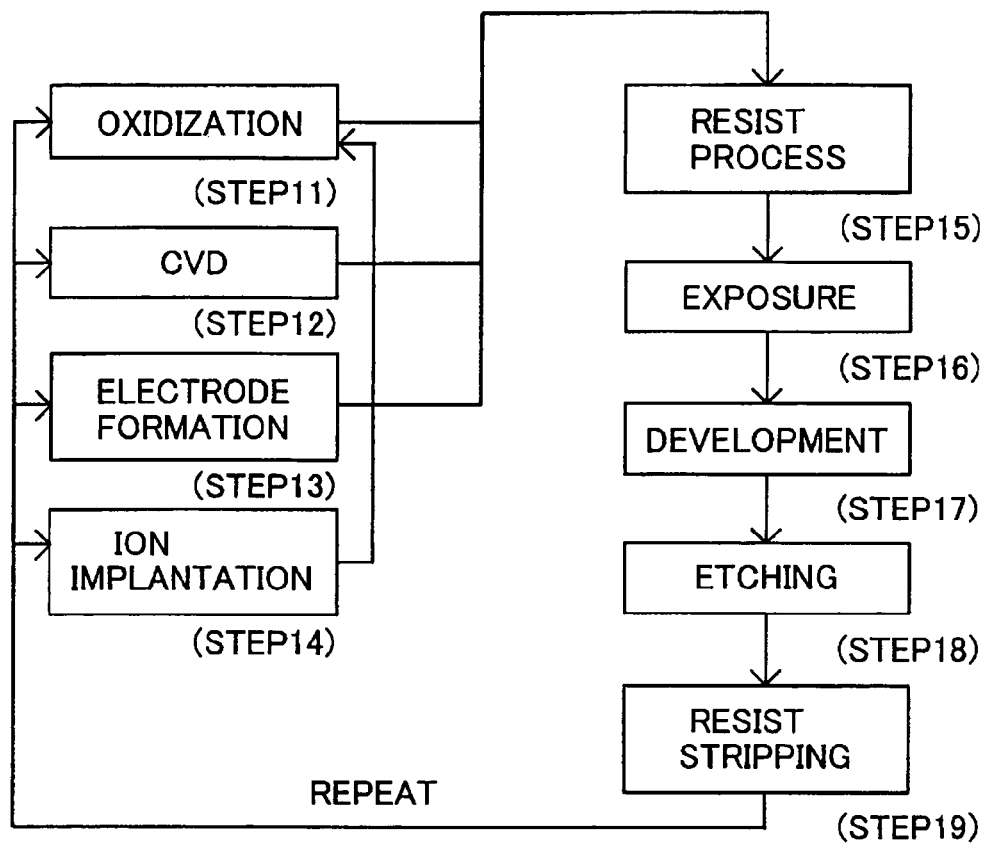
FIG. 9 is a detailed flowchart for a wafer process shown in FIG. 8.
Figure 10A:
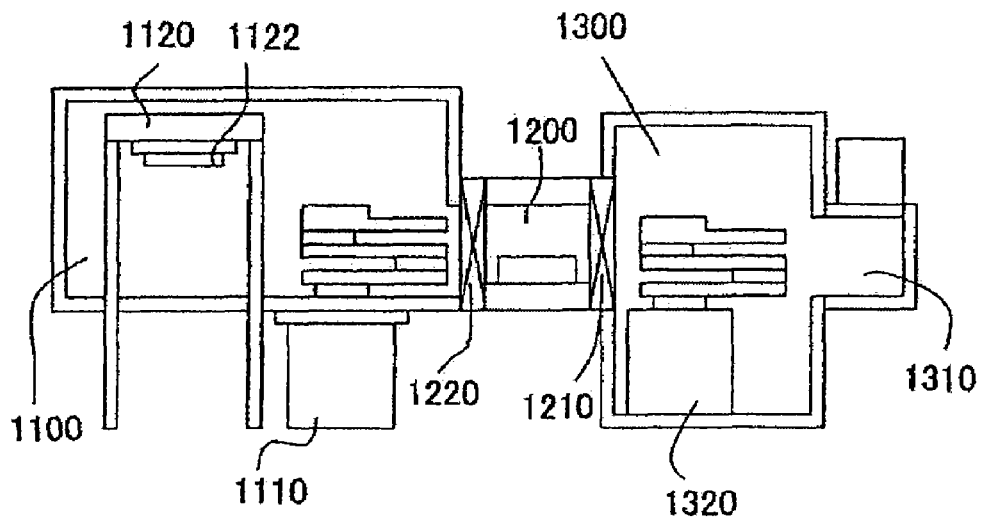
FIGS. 10A and 10B are schematic block diagrams showing a structure of a conventional processing unit.
Figure 10B:
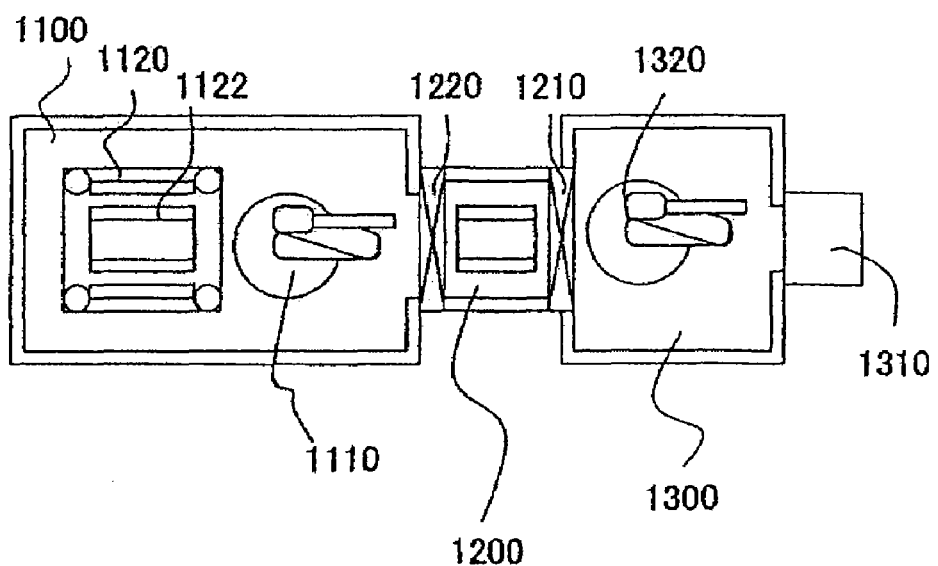

Referring to FIGS. 8 and 9, a description will now be given of an embodiment of a device fabricating method using the processing unit 200 (the exposure apparatus 300). FIG. 8 is a flowchart for explaining a fabrication of devices (i.e., semiconductor chips, such as ICs and LSIs, LCDs, CCDs, etc.). In this embodiment, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 5 and includes an assembly step (e.g., dicing, bonding) a packing step (chip sealing), and the like. Step 6 (inspection) performs various tests for the semiconductor device made in Step 5, such as a validity test and a durability test. Through these steps, a semiconductor device is finished and shipped (Step 7).

FIG. 9 is a detailed flowchart of the wafer process shown in Step 4. Step 11 (oxidation) oxidizes the wafer's surface. Step 12 (CVD) forms an insulating film on the wafer's surface. Step 13 (electrode formation) forms electrodes on the wafer by vapor deposition, and the like. Step 14 (ion implantation) implants ions into the wafer. Step 15 (resist process) applies a photosensitive material onto the wafer. Step 16 (exposure) uses the exposure apparatus 300 to expose a circuit pattern on the mask onto the wafer. Step 17 (development) develops the exposed wafer. Step 18 (etching) etches parts other than a developed resist image. Step 19 (resist stripping) removes the unused resist after etching. These steps are repeated, and multilayer circuit patterns are formed on the wafer. The fabrication method of the present embodiment may manufacture higher quality devices than does the prior art. In this manner, the device fabricating method that uses the processing unit 200 (the exposure apparatus 300) and the device as a final product serve as other aspects according to the present invention.

So far, the preferred embodiments according to the present invention have been described, but the present invention is not limited to these embodiments, and various variations and modifications may be made without departing from the spirit and scope of the present invention. For example, the processing unit of this invention is applicable for transferring a plate such as a wafer, and the like. It goes without saying that the process chamber may include an exposure apparatus that uses UV light as exposure light, and other processing parts may be included.

What is claimed is:

1. A protection unit used to transfer a mask having a patterned surface from a mask stocker to a mask stage by a transfer unit that holds the mask by suction, the mask having a front surface and a back surface, the patterned surface being the front surface of the mask and having a pattern to be exposed onto a plate, said protection unit comprising:
   a holding part for holding the mask, said holding part including a contact part for contacting the back surface of the mask, said holding part holding the mask via the contact part; and
   a cover part for protecting the mask, said cover part being connected to the holding part and protecting the front surface of the mask in a non-contact manner, such that a space can be formed between the front surface of the mask and the cover part,
   wherein said protection unit covers the mask while leaving uncovered at least a part of the back surface of the mask, the part of the back surface of the mask being held by the transfer unit by suction.

2. The protection unit according to claim 1, wherein the cover part has air permeability and includes a filter for preventing particles from entering the space.

3. The protection unit according to claim 1, wherein the cover part has a transmission window that transmits light.

4. The protection unit according to claim 1, wherein the holding part uses electrostatic adsorption to hold the mask.

5. The protection unit according to claim 1, wherein the contact part is made of a soft material.

6. The protection unit according to claim 5, wherein the soft material is polyimide resin.

7. An exposure method for exposing a pattern of a mask onto a plate using an exposure apparatus housed in a process chamber under reduced pressure or a vacuum atmosphere, the mask having a front surface and a back surface, the patterned surface being the front surface of the mask, said exposure method comprising the steps of:
   (a) holding the mask via a protection unit, the protection unit comprising:
      (i) a holding part for holding the mask, the holding part including a contact part for contacting the back surface of the mask, the holding part holding the mask via the contact part; and
      (ii) a cover part for protecting the mask, the cover part being connected to the holding part and protecting the front surface of the mask in a non-contact manner, such that a space can be formed between the front surface of the mask and the cover part,
      wherein the holding part and the cover part cover the mask while leaving uncovered at least a part of a back surface of the mask;
   (b) transferring the protection unit and the mask to the process chamber by a transfer unit that holds a part of the back surface of the mask by suction, which part is not covered by the protection unit;
   (c) holding the part of the back surface of the mask by a mask chuck in an exposure apparatus in the process chamber while the transfer unit holds the part of the back surface of the mask by suction; and
   (d) separating the protection unit from the mask in the process chamber after the back surface of the mask is held by the mask chuck.

8. The exposure method according to claim 7, wherein said transferring step transfers the mask with the patterned surface directed in a direction of gravity.

9. The exposure method according to claim 7, further comprising holding the mask on the back surface of the mask in all steps, while the mask is transferred from a mask stocker to the mask chuck.

* * * * *